United States Patent
Kuczynski et al.

(10) Patent No.: US 9,721,855 B2
(45) Date of Patent: Aug. 1, 2017

(54) ALIGNMENT OF THREE DIMENSIONAL INTEGRATED CIRCUIT COMPONENTS

(71) Applicant: International Business Machines Corporation, Armonk, NY (US)

(72) Inventors: Joseph Kuczynski, North Port, FL (US); Phillip V. Mann, Rochester, MN (US); Kevin M. O'Connell, Rochester, MN (US); Arvind K. Sinha, Rochester, MN (US); Karl Stathakis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/568,356

(22) Filed: Dec. 12, 2014

(65) Prior Publication Data

US 2016/0172324 A1   Jun. 16, 2016

(51) Int. Cl.
*B23K 3/047* (2006.01)
*B23K 3/08* (2006.01)
*H01L 23/00* (2006.01)
*H01L 21/66* (2006.01)
*B23K 1/00* (2006.01)
(Continued)

(52) U.S. Cl.
CPC ............ *H01L 22/20* (2013.01); *B23K 1/0016* (2013.01); *B23K 1/20* (2013.01); *B23K 3/047* (2013.01); *B23K 3/0623* (2013.01); *B23K 3/08* (2013.01); *H01L 24/75* (2013.01); *H01L 24/81* (2013.01); *H01L 22/12* (2013.01); *H01L 2224/757* (2013.01); *H01L 2224/818* (2013.01); *H01L 2224/81125* (2013.01);
(Continued)

(58) Field of Classification Search
USPC ............ 257/737; 438/5; 228/9, 246, 179.1; 427/127; 360/234.6; 29/603.6
See application file for complete search history.

(56) References Cited

U.S. PATENT DOCUMENTS 6,142,361 A    11/2000 Downes, Jr. et al.
6,426,282 B1 *  7/2002 Saigal .................. H01L 21/6833
                                        257/E21.508
(Continued)

OTHER PUBLICATIONS

NPL, Non-Final Rejection.*
(Continued)

*Primary Examiner* — Zandra Smith
*Assistant Examiner* — Lawrence Tynes, Jr.
(74) *Attorney, Agent, or Firm* — Wood, Herron & Evans, LLP; Robert R. Williams

(57) ABSTRACT

A method for aligning a chip onto a substrate is disclosed. The method includes, depositing a ferrofluid, onto a substrate that has one or more pads that electrically couple to a semiconductor layer. The method can include a chip with solder balls electrically coupled to the logic elements of the chip, which can be placed onto the deposited ferrofluid, where the chip is supported on the ferrofluid, in a substantially coplanar orientation to the substrate. The method can include determining if the chip is misaligned from a desired location on the substrate. The method can include adjusting the current location of the chip in response to determining that the solder balls of the chip are misaligned from the desired location on the pads of the substrate, until the chip is aligned in the desired location.

10 Claims, 10 Drawing Sheets

(51) Int. Cl.
*B23K 1/20* (2006.01)
*B23K 3/06* (2006.01)

(52) U.S. Cl.
CPC ............. *H01L 2224/81191* (2013.01); *H01L 2224/81359* (2013.01); *H01L 2224/81908* (2013.01)

(56) References Cited

U.S. PATENT DOCUMENTS

| | | | |
|---|---|---|---|
| 6,657,289 B1 | 12/2003 | Craig et al. | |
| 8,349,653 B2 | 1/2013 | Parvarandeh | |
| 8,592,952 B2 | 11/2013 | Jo et al. | |
| 8,669,137 B2 | 3/2014 | Nah et al. | |
| 2002/0140949 A1* | 10/2002 | Sasaki | G01N 21/95684 356/606 |
| 2002/0167307 A1* | 11/2002 | Chaparala | G02B 26/0841 324/207.13 |
| 2004/0115340 A1* | 6/2004 | Griego | B23K 35/0244 174/126.2 |
| 2004/0182913 A1* | 9/2004 | Deane | H01L 24/81 228/180.22 |
| 2006/0234405 A1 | 10/2006 | Best | |
| 2009/0072012 A1* | 3/2009 | Sakaguchi | B23K 3/0623 228/246 |
| 2011/0147044 A1* | 6/2011 | Harvey | H01L 21/563 174/126.1 |
| 2013/0252375 A1 | 9/2013 | Yi et al. | |
| 2015/0048520 A1* | 2/2015 | Skinner | H01L 23/32 257/777 |

OTHER PUBLICATIONS

Kuczynski et al., "Alignment of Three Dimensional Integrated Circuit Components", U.S. Appl. No. 14/573,641, filed Dec. 17, 2014.

List of IBM Patents or Patent Applications Treated as Related.

Liu, J., "Recent Advances in Conductive Adhesives for Direct Chip Attach Applications", The First IEEE International Symposium on Polymeric Electronics Packaging, 1997, 107-122.

Lu, A., Salabas, E.L., Schuth, F., "Magnetic Nanoparticles: Synthesis, Protection, Functionalization, and Application," Angewandte Chemie International Edition, Feb. 2007, vol. 46, Issue 8, pp. 1222-1244, Copyright 2007 Wiley-VCH Verlag GmbH & Co. KGaA, Weinheim.

* cited by examiner

ALIGNMENT OF THREE DIMENSIONAL INTEGRATED CIRCUIT COMPONENTS

BACKGROUND

The present disclosure relates to a process of semiconductor device manufacturing of Three Dimensional Integrated Circuits (3DIC). More specifically, to the use of ferrofluids to adjust the positioning of a chip, to align the chip onto a substrate.

Three Dimensional Integrated Circuits (3DIC) can have various advantages relative to other integrated circuits. For example, in some instances, 3DIC can be more compact due to their three-dimensional structure, more energy efficient due to the reduction in wiring. 3DIC can also have increased computing power as logic and memory chips can be stacked together in order to decrease latency and increase chip density.

SUMMARY

Embodiments of the present disclosure are directed towards a method for aligning a chip onto a substrate.

One embodiment is directed toward a method for aligning a chip onto a substrate including, depositing a ferrofluid, where the ferrofluid is a colloidal liquid consisting of magnetic nanoparticles suspended within a solvent with a particular surface tension, onto a substrate that has one or more pads that electrically couple to a semiconductor layer. The method can include a chip with solder balls electrically coupled to the logic elements of the chip, which can be placed onto the deposited ferrofluid, where the chip is supported on the ferrofluid, in a substantially coplanar orientation to the substrate. The method can include determining if the chip is misaligned from a desired location on the substrate. The method can include adjusting the current location of the chip in response to determining that the solder balls of the chip are misaligned from the desired location on the pads of the substrate, until the chip is aligned in the desired location.

A second embodiment is directed toward an apparatus which can include a control unit, and a magnetic unit. The magnetic unit of the apparatus, manipulates a position of one or more solder balls of a chip relative to the one or more pads of a substrate by moving a ferrofluid, using a magnetic field. The control unit of the apparatus, includes a processor that is communicatively coupled to a memory to determine alignment of a chip on the substrate, and output data based on the position of the chip. The control unit also includes depositing the ferrofluid onto the substrate, placing a chip that is supported by the ferrofluid in a substantially coplanar orientation to the substrate. The control unit can then determine that the one or more solder balls of the chip are misaligned from a desired location on the one or more pads of the substrate, and adjust the location the one or more solder balls into the final location above the one or more pads of the substrate.

According to embodiments of the present disclosure, an alignment method is introduced to stack 3DIC packages by using ferrofluids to align a chip above a substrate. The method allows for fine alignment alterations to the location of the chip on the substrate to be made.

The proposed alignment method uses tunable magnetic fields to manipulate a magnetic nanofluid of a particular viscosity to position a chip onto a substrate. The chip's location is monitored and altered until the chip reaches the desired final location on the substrate, the chip is then lowered onto the substrate, and the chip is bonded in place onto the substrate.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
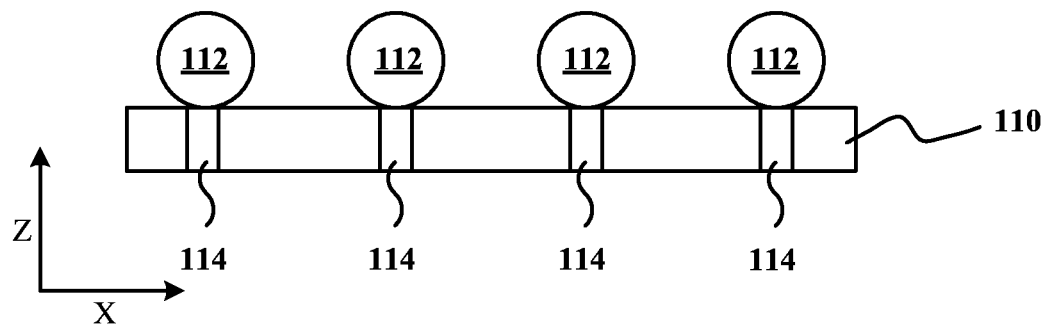
FIG. 1A illustrates a side view of a prepared chip, according to various embodiments.

While the method is amenable to various modifications and alternative forms, specifics thereof have been shown by way of example in the drawings and will be described in detail. It should be understood, however, that the intention is not to limit the method to the particular embodiments described. On the contrary, the intention is to cover all modifications, equivalents, and alternatives falling within the spirit and scope of the disclosure.

DETAILED DESCRIPTION

Aspects of the present disclosure relate to the alignment method is introduced to stack 3DIC packages by using ferrofluids to align a chip above the substrate. More particular aspects relate to three-dimensional integrated circuit (3DIC) chip alignment. While the present disclosure is not necessarily limited to such applications, various aspects of the disclosure can be appreciated through a discussion of various examples using this context.

Methods of mounting chips onto substrates are known as "Flip chip" techniques where a chip and a substrate are connected via solder balls which are first situated on the chip. The chip is then flipped so the solder ball come in contact with the substrate, and the solder ball is reflowed to bond and electrically couple the chip to the substrate.

However, the alignment of the chip to the substrate requires precision especially in Three Dimensional Integrated Circuits (3DIC). Each solder ball must be aligned above each through-silicon via (TSV) for each subsequent chip, or the circuit cannot be completed. If the TSV of a single chip is not completed each subsequent chip after the incomplete circuit will not be conductive causing computing errors. The circuit leads to the semiconductor layer which power the chip system. A semiconductor layer can be for example a silicon layer containing a multitude of transistors.

One embodiment is directed toward a method for aligning a chip onto a substrate including, depositing a ferrofluid, where the ferrofluid is a colloidal liquid consisting of magnetic nanoparticles suspended within a solvent with a particular surface tension, onto a substrate that has one or more pads that electrically couple to a semiconductor layer. The method can include a chip with solder balls electrically coupled to the logic elements of the chip, which can be placed onto the deposited ferrofluid, where the chip is supported on the ferrofluid, in a substantially coplanar orientation to the substrate. The method can include determining if the chip is misaligned from a desired location on the substrate. The method can include adjusting the current location of the chip in response to determining that the solder balls of the chip are misaligned from the desired location on the pads of the substrate, until the chip is aligned in the desired location.

A ferrofluid is a liquid of a particular viscosity that can be manipulated using a tunable magnetic field. Ferrofluids are made up of magnetic particles that can be supported by Brownian motion, and a liquid carrier. Brownian motion is the random collision of larger molecules with smaller faster molecules to keep the larger molecules moving within the solution, keeping the mixture from separating, which allows the ferrofluid to keep shape as well as move as a fluid. An example of ferrofluid can include, but is not limited to, a colloidal liquid made of magnetic nanoparticles, which are coated with surfactants to inhibit clumping, that are suspended in a solvent. The ferrofluid reacts to changes in magnetic fields and can be manipulated within three-dimensions. The movement and direction of the ferrofluid can respond to and vary in accordance with a location and proximity of a magnetic field. Depending on the solvent the ferrofluid can have a particular surface tension and viscosity, both of which can determine the adjustability of the ferrofluid.

Throughout the drawings, a Cartesian coordinate system is given on the lower left of each drawing, the movements of the chip above the substrate can be referred to using the Cartesian coordinate system by direction of travel. For example moving the chip in the Z direction will constitute an up-or-down movement, or movement toward and away from the substrate. For example moving the chip in the X or Y direction will constitute traverse movement, or movement coplanar with the substrate.

Figure 1B:
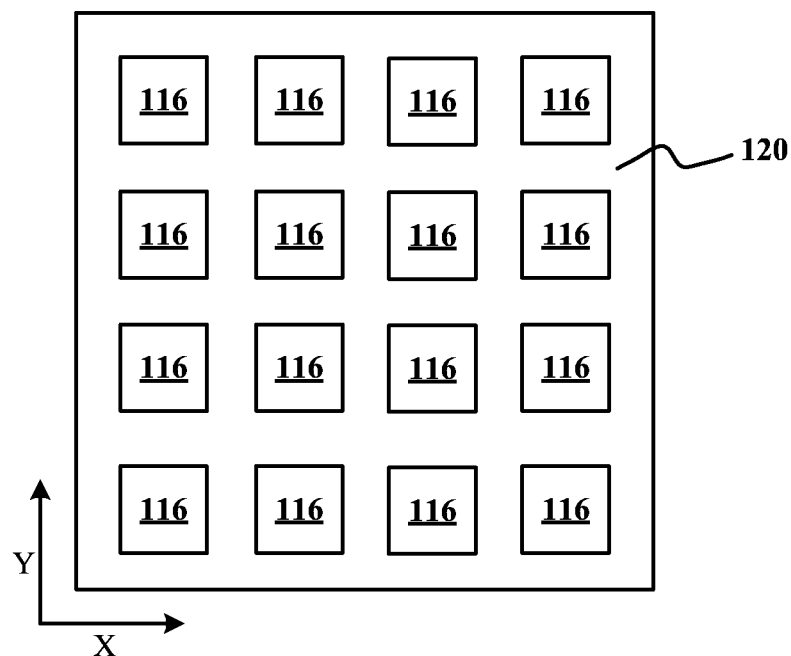
FIG. 1B illustrates a top down view of a prepared substrate, according to various embodiments.

Referring now to FIG. 1A and FIG. 1B a chip 110 and a substrate 120 are prepared, according to embodiments the present disclosure. The chip 110 and the substrate 120 are in no way limited to the embodiments of the drawing but are purely as examples. FIG. 1A shows a cross sectional side view of the chip 110 including one or more solder balls 112 attached to an end of a through-silicon via 114 on the chip 110. An example of a solder ball can be a mircobump which are placed in position on the chip 110 that can complete an electrical current from the substrate 120 to logic elements of the chip 110 to bind the logic elements of the system, depending on the configuration of the chip 110 and substrate 120. Examples of chips 110 can include but are not limited to dies which are small blocks of semiconducting material, integrated circuits, such as semiconductor devices like a micro-processor, or memory devices such as random-access memory (RAM). FIG. 1B shows the substrate 120 with pads 116. In embodiments, the pads 116 are a powered end of a through-silicon via used to couple the chip 110 (FIG. 1A) electrically to the substrate 120. In embodiments, the substrate 120 can be a wafer, an example of a wafer is a thin slice of semi conductible material for circuit fabrication. In some embodiments, the substrate 120 can be a second chip for example a second chip is a previously attached chip to be bound to the new first chip 110.

Figure 2A:
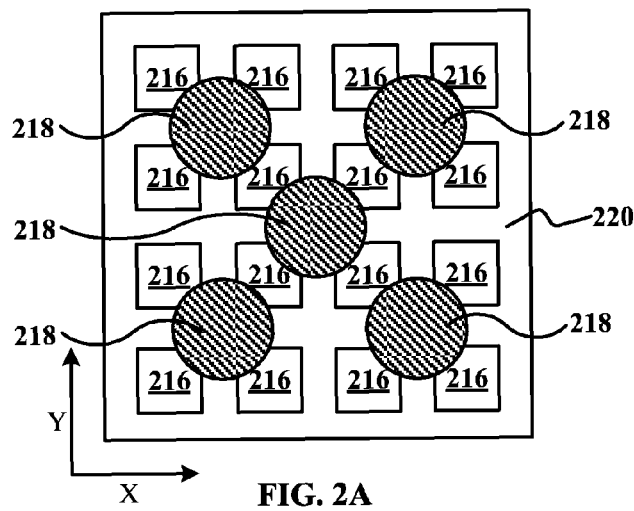
FIG. 2A illustrates a top down view of the prepared substrate with multiple portions of ferrofluid, according to various embodiments.
Figure 2B:
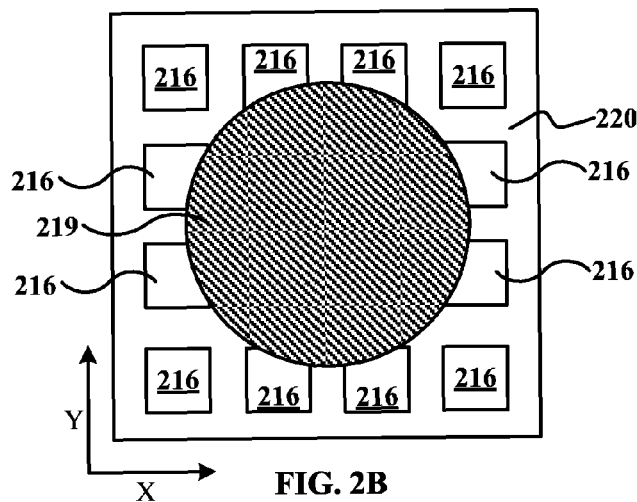
FIG. 2B illustrates a top down view of the prepared substrate with a single portion of ferrofluid, according to various embodiments.
Figure 2C:
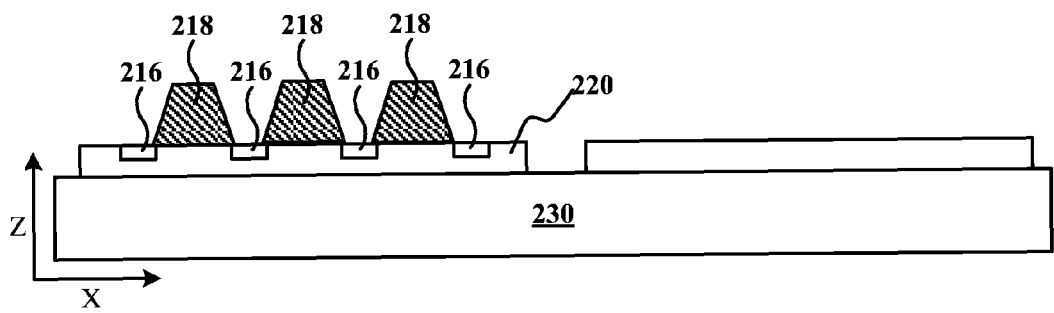
FIG. 2C illustrates a side view of the prepared substrate with multiple portions of ferrofluid, according to various embodiments.

FIG. 2A and FIG. 2B show top down views of two example preparations of a ferrofluid on a substrate 220, according to embodiments of the present disclosure. In FIG. 2A and FIG. 2B two of many possible examples of ferrofluid deposition onto the substrate 220 are shown. FIG. 2A multiple portions of a ferrofluid 218 can be seen deposited onto the substrate 220. In the example of FIG. 2A the ferrofluid 218 is deposited with five portions, four being on the corners one in the center of the substrate 220, with pads 216, for stabilization throughout the movement of the chip. In FIG. 2B a single portion of a ferrofluid 219 can be deposited onto the substrate 220, in FIG. 2A the example the single portion is deposited in the direct center of the substrate 220 for stabilization throughout the movement of a chip. FIG. 2A and FIG. 2B are not meant to limit the deposition of the ferrofluid on the substrate 220 but are offered as two possible examples. The use of multiple portions of ferrofluid 218 or single portions of ferrofluid 219 depend on the size of the chip and the surface tension of the carrier liquid, for example if the chip is very small and light a single portion can work optimally because it is able to support the weight of the chip and you will not have to worry about multiple portions combining causing the chip to not be coplanar with the substrate 220. Whereas in another example multiple portions of ferrofluid 218 if the chip is larger, the multiple portions of ferrofluid 218 can support the weight of the chip and keep it still substantially coplanar to the substrate 220. In another example FIG. 2C shows a side view of FIG. 2A, with the ferrofluid 218 on top of the substrate 220, with pads 216, and the substrate 220 that has been placed on a support unit 230.

Figure 3A:
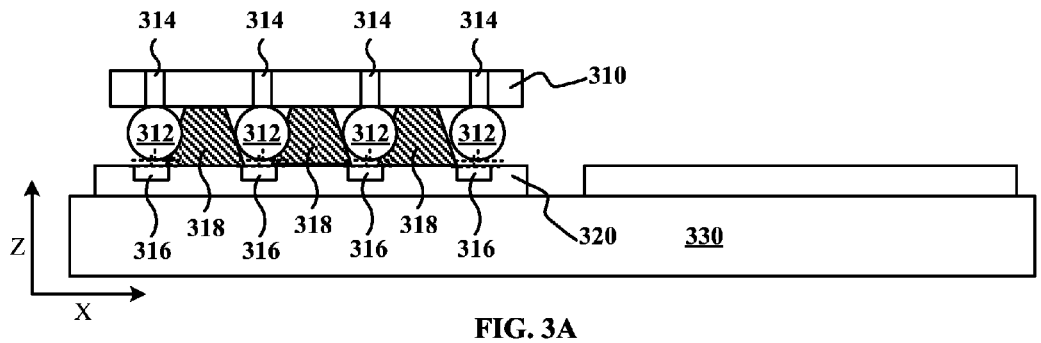
FIG. 3A illustrates a chip placed in rough alignment, with reference cross hairs, above a substrate being supported by ferrofluid, according to various embodiments.
Figure 3B:
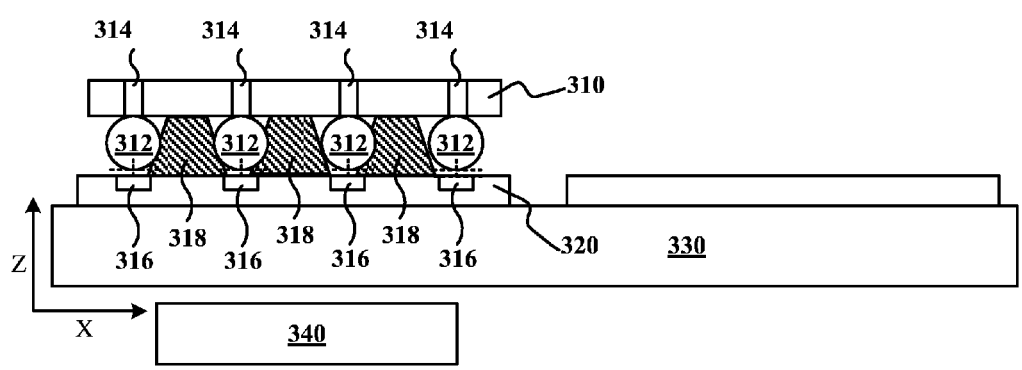
FIG. 3B illustrates a magnetic unit below the support unit to adjust the location of the chip, with reference cross hairs, according to various embodiments.
Figure 3C:
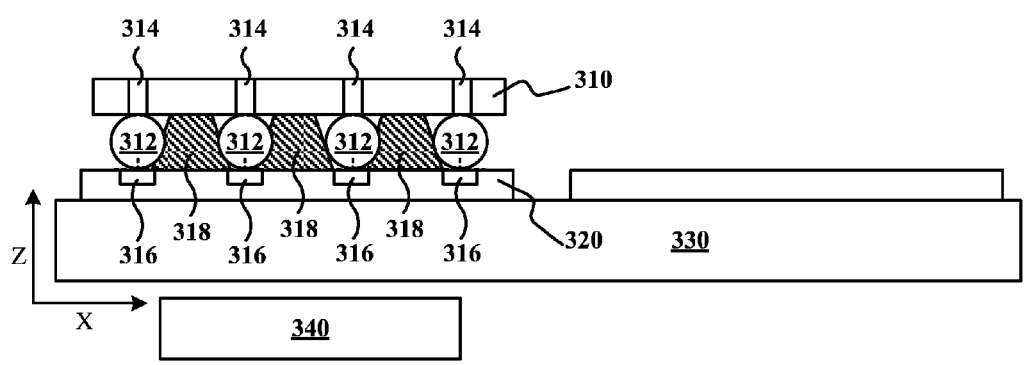
FIG. 3C illustrates the lowering of the chip into place after alignment, with reference cross hairs, according to various embodiments.

Referring now to FIGS. 3A-3C side views of a chip 310 alignment above a substrate 320 can be seen, according to embodiments of the present disclosure. Consistent with embodiments, in FIG. 3A, the chip 310 is placed in rough alignment to the desired final location, where solder balls 312 are aligned with pads 316, above the substrate 320 which is supported on a support unit 330. An example of rough alignment, is the placement of the chip 310 on the ferrofluid 318 such that the chip will not require an excessive amount of adjustment from the magnetic unit to get it into place. In embodiments, the solder balls 312 are attached to through-silicon vias 314 on the chip 310. In embodiments, the solder balls 312 face the pads 316 of the substrate 320. The chip 310 can be placed such that the ferrofluid 318 physically supports the chip 310 using the surface tension of the ferrofluid 318 to support the chip 310 a coplanar orientation relative to the substrate 320. The surface tension for example depends on the surface tension of the solvent used for the production of the ferrofluid 318. The movement of the chip 310 can be for example dragged along with the ferrofluid 318 by the surface tension of the ferrofluid 318 altering the position of the chip, which will be referred to as adjustment of the chip 310. Dotted alignment reference lines are given on the bottom of the solder balls 412 an on top of the pads 316 to show the center for alignment which will be explained further in FIG. 11.

In FIG. 3B a magnetic unit 340 is used to manipulate a ferrofluid 318 to move a chip 310 into a final location above a substrate 320 on a support unit 330. The magnetic unit 340 can be for example a tunable magnetic field, by moving the magnetic field of magnetic unit 340 directionally, the ferrofluid 318 will move along with the magnetic unit 340 in the traverse direction, or referring to the Cartesian coordinates the chip 310 will move in the X or Y direction. For example in some embodiments to move the chip 310 closer to the substrate 320 or further away from the substrate 320 can be done by increasing or decreasing the magnetic field of the magnetic unit 340. For example in some embodiments, the chip 310 can be moved up and down by moving the magnetic unit 340 closer or farther away, the chip 310 is moved in a latitudinal direction, or up and down in the Z direction on the Cartesian coordinate system. In some instances, before moving the chip 310 into place, the height of the ferrofluid 318 can be greater than the height of the solder balls 312 of the chip 310. The height adjustment of the chip 310 can be done by using the magnetic unit to manipulate the ferrofluid 318. For example, a magnetic unit 340 can give off a magnetic field for manipulating the ferrofluid 318. The magnetic field, along with the viscosity of the ferrofluid 318 allows the ferrofluid 318 to support and move the chip 310 such that when the position of the ferrofluid 318 is changed the chip 310 will move as well. The chip 310 will be able to be moved in a three-dimensional space by using the magnetic unit 340. The support of the chip 310 by the ferrofluids 318 surface tension which can support the chip 310 during the adjustment of the ferrofluid 318, because of the surface tension of the ferrofluid 318 can hold the chip 310 as the ferrofluid 318 is adjusted, due to the nature of ferrofluids their surface tension along with a tunable magnetic field allows for a stable adjustment medium, which the position and size of can be altered by the magnetic unit 340.

Before the chip 310 can be moved into place on the substrate 320 the height of the ferrofluid 318 must be greater than the height of the solder balls 312. Height can be defined by the using the Cartesian coordinate system by distance from start to finish in the Z axis for example, the height of the solder ball 312 can be measured by the top of the solder ball 312 which is in contact with the chip 310 to the opposite end of the solder ball 312 to come in contact with the pad 316 of the substrate 320 in a straight line. For example the approximate height of the solder balls 312 can be 200 µm, so the height of the ferrofluid 318 should be greater than 200 µm to hold the chip 310 from being in contact with the substrate 320 before alignment is achieved. In embodiments, the height of the ferrofluid 318 for example, can be adjusted by increasing the amount of ferrofluid 318 by adding a particular volume of the ferrofluid 318 between the chip 310 and substrate 320, the particular volume depends on how the ferrofluid was initially placed on the chip. In some embodiments, the height adjustment of the ferrofluid 318 could be done by increasing the magnetic fields strength using the magnetic unit 340 causing the ferrofluid 318 to increase in height raising the chip in the Z direction. An example of the strength of the magnetic field, can be measured to determine an appropriate range of strengths depending on the properties of the ferrofluid, for fine adjustment the tunable magnetic field can be lowered to a power on the millitesla scale for miniscule alterations of the location of the ferrofluid 318 moving the chip 310. The chip 310 can then be monitored for misalignment in a three-dimensional space in relation to a final alignment location in the X and Y plane above the substrate 320 while the chip 310 is adjusted using magnetic unit 340 for final alignment.

In FIG. 3C a chip 310 is lowered into place on a substrate 320. For example the chip 310 can be lowered by decreasing the magnetic field from a magnetic unit 340, decreasing the height of a ferrofluid 318 placing the chip 310 into place on the substrate 320 where the solder balls 312 are in contact with the pads 316 of the substrate 320. The dotted alignment lines are overlapping to show that the solder balls 312 and the pads 316 are in alignment within all three-dimensions.

Figure 11A:
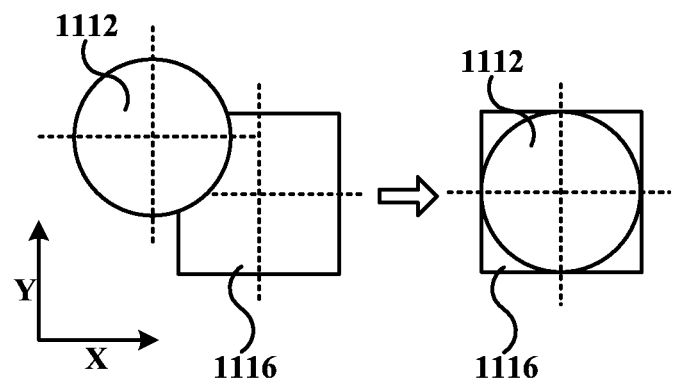
FIG. 11A illustrates a top down view of a solder ball being aligned to a pad, with reference cross hairs, according to various embodiments.
Figure 11B:
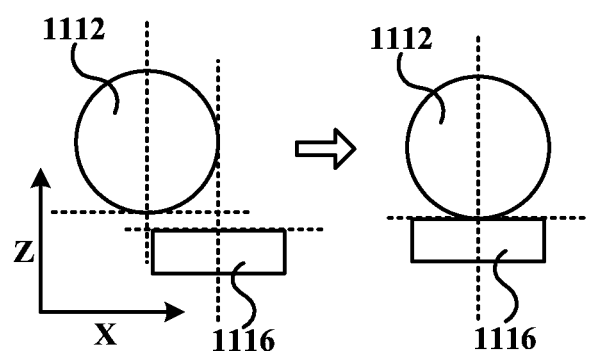
FIG. 11B illustrates a side view of a solder ball being aligned to a pad, with reference cross hairs, according to various embodiments.

Referring now to FIGS. 11A-11B shows alignment of a solder ball 1112 onto a pad 1116. In FIG. 11A a top down view is seen of alignment of a solder ball 1112 onto a pad 1116, where the solder ball 1112 is determined to be misaligned from the pad 1116. The alignment of the solder ball 1112 to the pad 1116 seen in FIG. 11A is done in the traverse direction, or by using the Cartesian coordinates in the X and Y directions, where adjusting the magnetic field and moving the chip with attached solder balls 1112 as portrayed in FIGS. 3A through 3C to align the solder balls 1112 with the pads 1116. For an example reference crosshairs shown as a dotted line to show the center alignment are given to show the misalignment of the solder ball 1112 and the pad 1116. In FIG. 11B is a side view is seen for the alignment of the solder ball 1112 to the pad 1116. The alignment of the solder balls 1112 to the pad 1116 seen in FIG. 11B is done in an up-or-down movement along with the traverse movement, or using the Cartesian coordinates in the Z direction for the up-and-down movement, and the X or Y direction for traverse movement. Adjusting the magnetic field, and moving the chip with attached solder balls 1112 is portrayed in FIGS. 3A through 3C to align the solder balls 1112 with the pads 1116. For an example reference crosshairs shown as a dotted line to show the center alignment are given to show the misalignment of the solder ball 1112 and the pad 1116. For example, the alignment can be considered completed when the solder ball 1112 is aligned with the pad 1116 where the dotted reference lines are aligned.

Figure 4A:
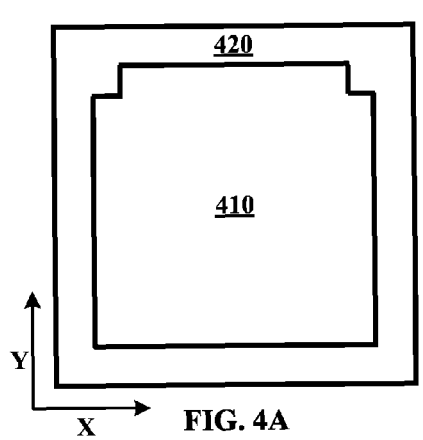
FIG. 4A illustrates a top down view of an aligned chip on a substrate, according to various embodiments.
Figure 4B:
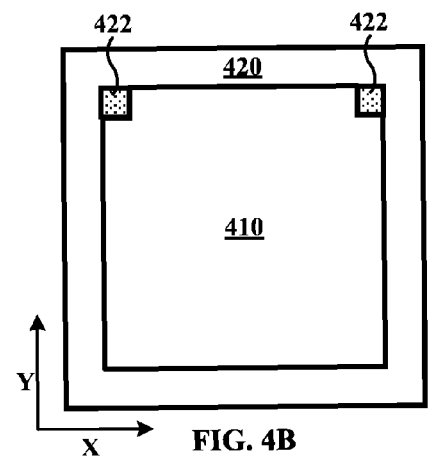
FIG. 4B illustrates a top down view of an aligned chip being tacked onto a substrate, according to various embodiments.
Figure 4C:
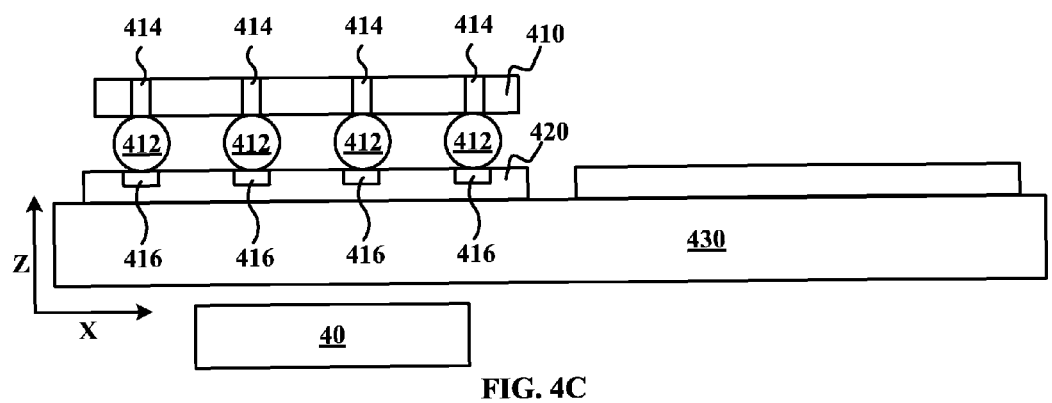
FIG. 4C illustrates a side view of the chip tacked to the substrate being electrically coupled to the substrate after being washed to remove ferrofluid, according to various embodiments.

Referring now to FIGS. 4A-4C an attachment process of a chip 410 to a substrate 420 can be seen, according to embodiments of the present disclosure. FIG. 4A shows a top down view of the chip 410 on the substrate 420. In FIG. 4B The chip 410 can be tacked 422 in place, so that the ferrofluid can be removed or dispersed from the individual chips without moving the chip 410 once the chip is in place, on the substrate 420 in the tack 422 for example can be an ultra-violet (UV) tack which is a UV curable adhesive which can be cured using UV light, the tacking process holds the chip 410 in place on the substrate 420, and allows for minimal movement of the chip after the tacking process. For example, the tacked chip 410 cannot move more than a few nanometers depending on the size of the pads 416 and the solder balls 412. For example if the solder ball 412 are only 200 µm in diameter and the pad 416 is only 50 µm the solder ball 412 must be able to stay in contact with the 50 µm pad 416. In the example embodiment of FIG. 4B the chip 410 is tacked 422 onto the substrate 420 only in the top two corners but the tacking process can be done in any number of places to adhere the chip to the substrate. In FIG. 4C the ferrofluid has been removed from the substrate 420, the substrate 420 is then washed, and dried after the removal or dispersion of the ferrofluid. The removal or dispersion of the ferrofluid can be done for example by an application of a strong unidirectional magnetic field to pull the ferrofluid from under the chip 410, off the substrate 420 by using magnetic unit 440, washing the substrate 420 to remove any residual ferrofluid with a solvent, and subsequently dried at a low temperature to remove any residual solvent. The solvent could be, for example, Isopropyl Alcohol (IPA). The chip 410 is then electrically coupled to the substrate 420. The electrical coupling for example, the solder balls 412 are reflowed by heating the solder balls 412 until the solder becomes fluid again, and then cooling the solder balls 412 to re-harden bonding to both the chip 410 end of a through-silicon via 414, and the substrate 420 end of the through-silicon via of a pad 416, on the substrate 420.

Figure 5:
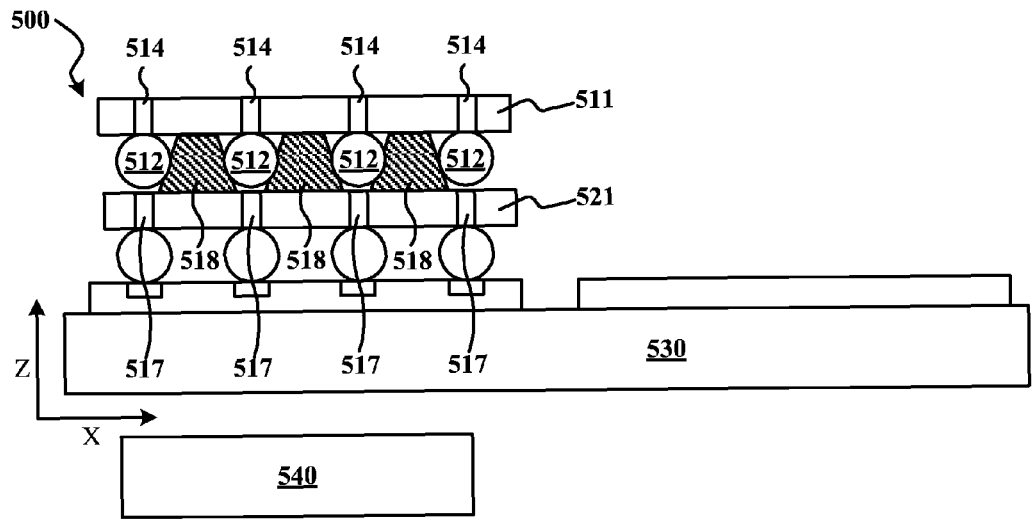
FIG. 5 illustrates a block diagram of binding a first chip to a second chip to create a three dimensional chip structure, according to various embodiments.

FIG. 5 shows a block diagram of an embodiment 500 of binding of a first chip 511 to a previous chip which can become a substrate 521. In the embodiment, the chip 511 is a new prepared chip 511 with solder balls 512 attached to the chips 511 end of through-silicon vias 514. The previously bonded chip becomes a second chip which will from then be called a substrate 521, and the second chips through-silicon vias become the pads 517 of the substrate 521. The substrate 521 can be the same or substantially similar to previously mentioned substrates. Ferrofluid 518 is placed on the top of the second chip which became the substrate 521 and the method is repeated until the desires chip structure is achieved. The repeating of the method allows for the support unit 530 to hold the new substrate 521 which was previously attached and coupled to the initial substrate. The magnetic unit 540 uses a tunable magnetic field to alter the position of chip 511 on the new substrate 521. The method can be repeated again where the new chip 511, can become the new substrate 521 after alignment and attachment of the new chip 511 to the substrate 521.

Figure 6:
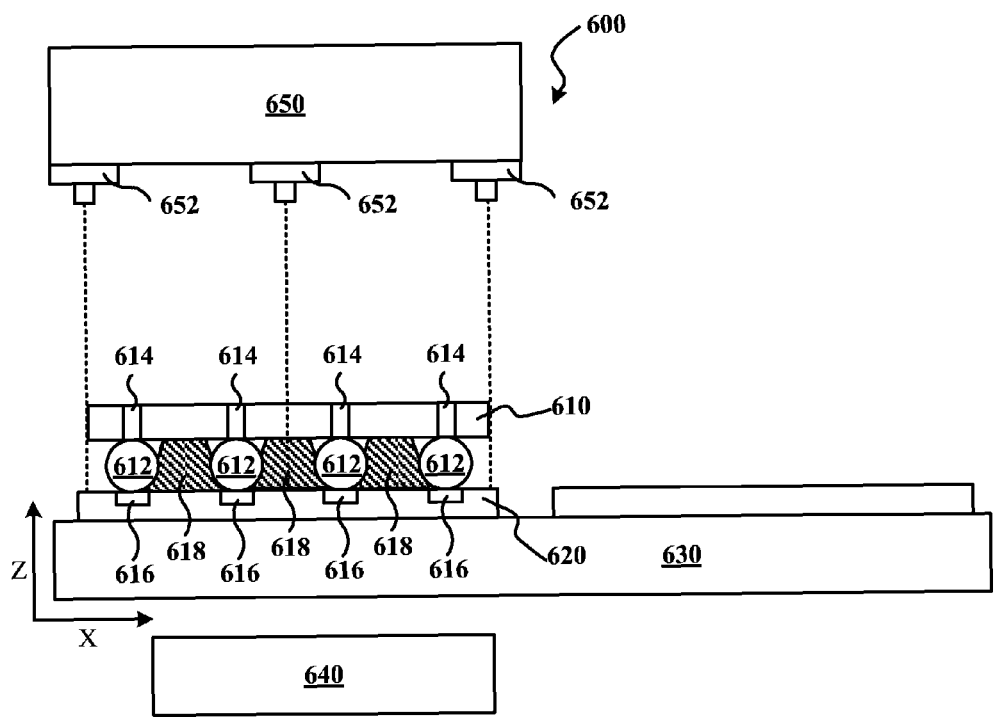
FIG. 6 illustrates an example of a control unit used to determine alignment of the chip on the substrate, according to various embodiments.

FIG. 6 shows a block diagram of an embodiment of an apparatus 600 for performing alignment, including a support unit 630, a magnetic unit 640, and a control unit 650. The support unit 630 is configured to hold a substrate 620 in place during the adjustment process of a ferrofluid 618 and a chip 610 on the substrate 620. For example the substrate 620 can be supported by the support unit 630 with small brackets keeping the substrate from moving in any direction.

The magnetic unit 640 is configured to adjust a location of a chip 610 on the ferrofluid 618 as the ferrofluid 618 supports the chip 610 in a three-dimensional space using the surface tension of the ferrofluid 618. The adjustment of the chip 610 can be based on data from the control unit 650 that is monitoring the alignment of the one or more solder balls 612 of the chip 610 onto the pads 616 of the substrate 620. The ferrofluid 618 for example, can be adjusted using a tunable magnetic field which is produced by the magnetic unit 640. The movement and direction of the ferrofluid 618 can respond to and vary in accordance with the location and proximity of the magnetic unit 640. The magnetic unit 640 is also able to increase a height of the ferrofluid 618 using adjustments in the magnetic field in response to a height of the solder balls 618 being greater than the height of the ferrofluid 618, and able to decrease the height of the ferrofluid 618 so that the solder balls 612 will come in contact with the substrate 620 after the chip 610 has been properly aligned in its final location. The magnetic unit 640 can be for example a tunable magnetic field, by moving the magnetic field directionally the ferrofluid 618 will move along with the magnetic unit 640 in a traverse direction, or using the Cartesian coordinates the X or Y direction. For example to move the chip 610 closer to the substrate 620 or further away can be done by increasing or decreasing the magnetic field, or moving the magnetic unit 640 closer or farther away, the chip 610 can be moved in a latitudinal direction, or up and down in the Z direction on the Cartesian coordinate system.

In various embodiments, the control unit 650 is configured to determine a final location of the chip 610 on the substrate 620 by using the determining devices 652 to output data based on a current location of the chip 610, which can be used by the magnetic unit 640 to move the chip 610 into place. For example, the chip 610 is placed onto the ferrofluid 618 with the solder balls 612 facing the substrate 620 and the control unit 650 can use the determining devices 652 to give a determination signal of misalignment, until the chip 610 is in place above the substrate 620. The determining devices 652 for example, can be a laser measuring system configured to determine when the chip 610 is aligned.

In various embodiments, an example procedure of alignment starts with the control unit 650 detecting that the chip 610 is not aligned using the determining devices 652, and data will be outputted based on the whether the chip 610 is aligned or not. For example, the control unit can contain a computing device including a memory and processor communicatively coupled, to store and relay information. If the chip 610 is not aligned the magnetic unit 640 will use a magnetic field to align the chip 610, using the ferrofluid 618, to the final location above the substrate 620, which is being held by the support unit 630. When the control unit 650 determines that the chip 610 is in place in the final location above the substrate 620 the magnetic unit 640 can lower the chip 610 into place, on top of the substrate 620.

Figure 7:
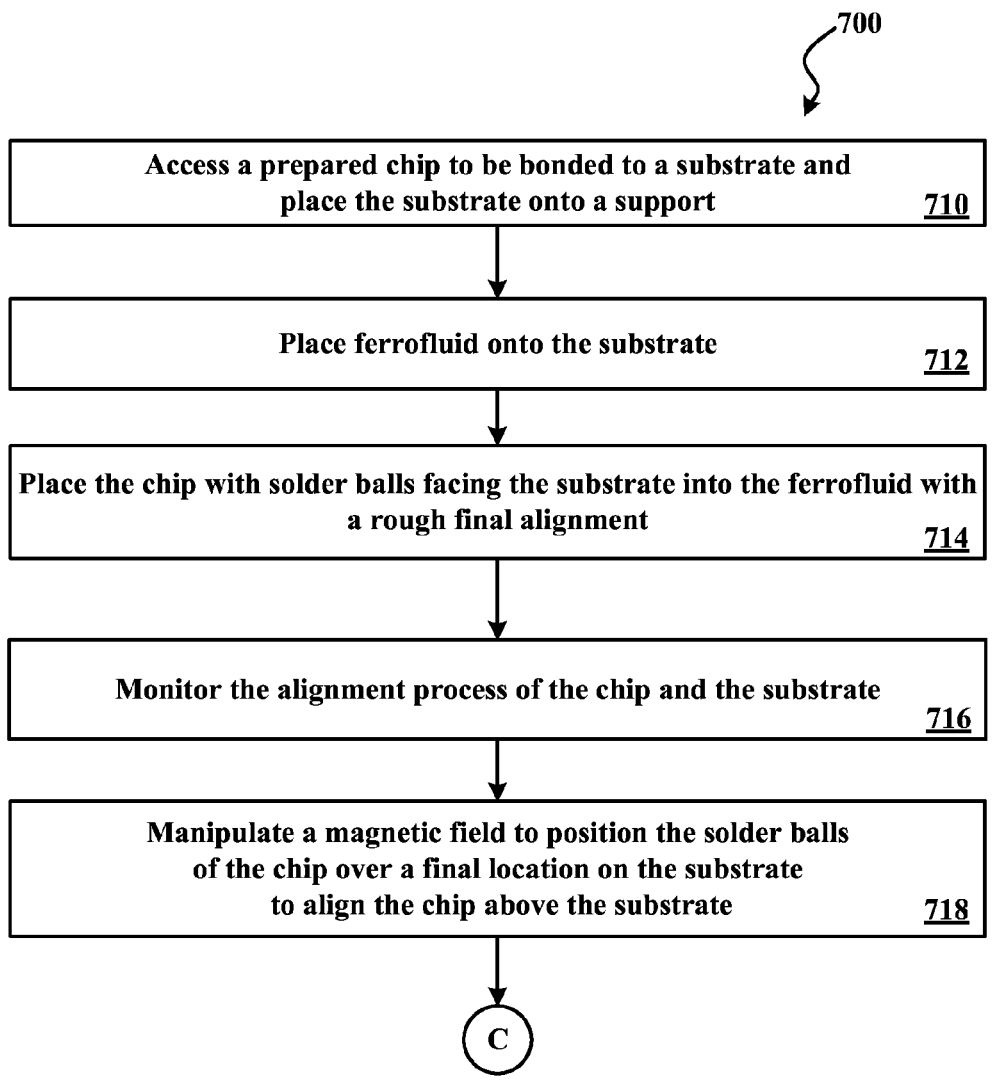
FIG. 7 is a flowchart of an overall alignment process of binding the chip to the substrate, according to various embodiments.

Referring now to FIG. 7 a flowchart showing operations of an alignment process 700 can be seen, according to embodiments of the present disclosure. In operation 710, a chip can be accessed to be bonded to a substrate where the substrate is placed onto a support, for example the substrate can be supported by setting the substrate into brackets on the support. In operation 712, a ferrofluid can be placed on the surface of the substrate. In operation 714, the chip with solder balls facing the substrate, is placed on the ferrofluid with a rough final alignment. In operation 716, the chip can be monitored during the alignment process to make sure that the chip is moved into the desired final location above the substrate. In operation 718, a tunable magnetic field can be manipulated to position the solder balls of the chip over the final location on the substrate. The tunable magnetic field allows for fine adjustments in the positioning of the chip on the substrate, by changing the location or strength of the magnetic field the ferrofluid can be adjusted accordingly. The adjustment of the ferrofluid, by the magnetic unit also in turn moves the chip using surface tension. Other examples of embodiments of the use of the tunable magnetic field, are further described herein.

Figure 8:
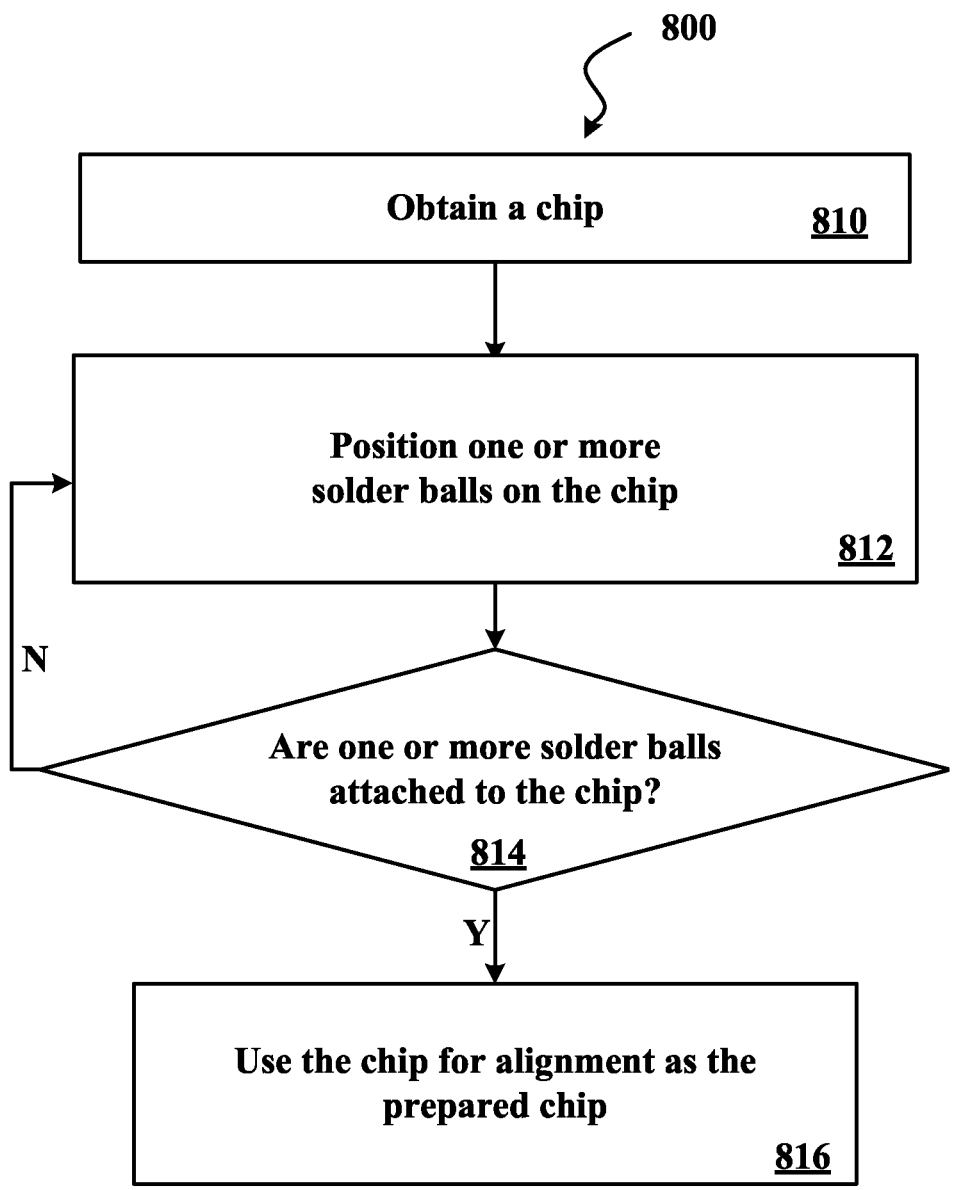
FIG. 8 is a flowchart of the operations of preparing a chip to be bound to a substrate, according to various embodiments.

Referring now to FIG. 8, a flowchart showing operations of preparing a chip to be bound to a substrate 800, to be used in operation 710. In operation 810, a chip is obtained, and one or more solder balls are positioned onto the chip 812. The positioning of the solder balls on the chip for example, could include screen printing the solder balls onto the surface of the chip to be bonded to a substrate. In operation 814, it is determined if the one or more solder balls are attached to the chip, if the solder balls are attached, then the chip is ready for alignment as the prepared chip 816 if not the process is repeated until the chip is ready to be used for the alignment method.

Figure 9:
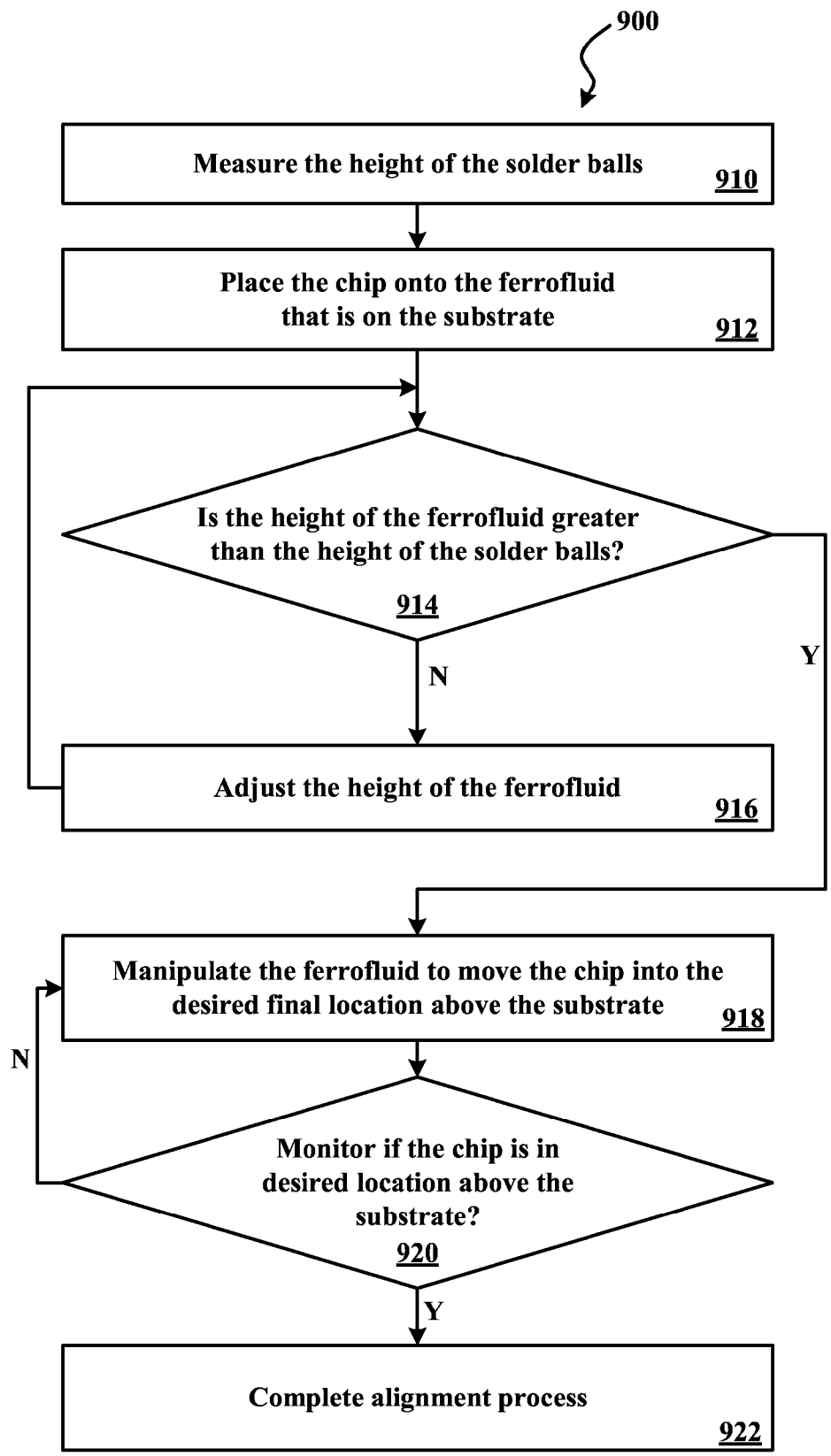
FIG. 9 is a flowchart of manipulating a magnetic field to align a chip above a final location of a substrate, according to various embodiments.

In FIG. 9 a flowchart showing operations manipulating a tunable magnetic field to align a chip above the final location on a substrate 900, an in-depth process of operation 718. In operation 910, the solder balls of the chip are measured to determine a height of the solder balls. In operation 912, the chip is then placed into a ferrofluid that is positioned on a substrate such that the solder balls that are attached to the chip are facing the substrate. In operation 914, a height of the ferrofluid is measured to determine if the height of the ferrofluid is greater than the height of the solder balls. If the height of the ferrofluid is less than the height of the solder balls the height of the ferrofluid is adjusted 916 and the height of the ferrofluid is determined again to find if the height of the ferrofluid is greater than the height of the solder balls. Examples of increasing the height of the ferrofluid can include but are not limited to, increasing the strength of a magnetic field, changing the location of the magnetic field, or by adding more ferrofluid between the chip and the substrate. If the height of the ferrofluid is determined to be greater than the height of the solder balls then the ferrofluid can be manipulated to move the chip into a desired final location above the substrate 918. In operation 920, the chip is then monitored to determine if the chip is in the desired final location above the substrate. If the chip is not in the desired final location the process returns back to the manipulation step 918, if the chip is determined by the control unit to be in the desired final location the alignment process is completed 922.

Figure 10:
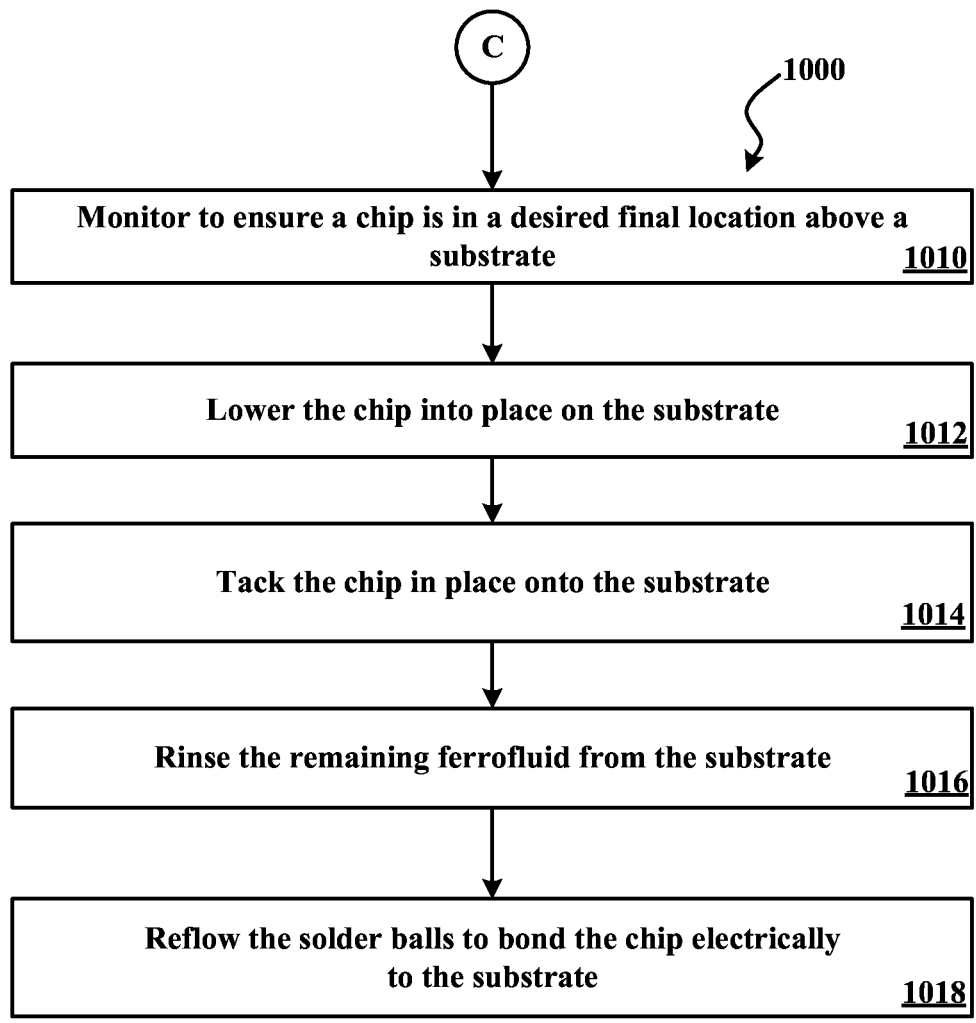
FIG. 10 is a flowchart of the operations of bonding of a chip to a substrate, according to various embodiments.

In FIG. 10, a flowchart showing operations a chip being bound to a substrate 1000 according to various embodiments, an in-depth binding operation of the continuation of FIG. 7. In operation 1010, the chip is monitored to ensure that the chip is in a desired final location above the substrate, if the chip in the desired final location the chip is then lowered into place on the substrate 1012 such that the chips solder balls are in contact with the substrates pads. In operation 1014, the lowering of the chip can be done for example, by decreasing a magnetic field on a ferrofluid which is supporting the chip. The chip can then be tacked into place on the substrate for example, UV tack can be used. In operation 1016, the remaining ferrofluid can be rinsed off of the substrate, for example, a solvent such as Isopropyl Alcohol (IPA) can be used. In operation 1018, after the chip has been tacked into place and rinsed, the solder balls can be reflowed 1018 to bond the chip electrically coupling the chip to the substrate.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, an engine, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:
1. An apparatus comprising:
a magnetic unit, configured to manipulate a position of one or more solder balls of a chip relative to the one or more pads of a substrate by moving a ferrofluid, using a magnetic field;
a control unit, comprising:
a memory,
a processor, communicatively coupled to the memory
wherein the memory includes a stored control program including instructions for executing on the processor to cause the control unit to:
deposit the ferrofluid, the ferrofluid being a colloidal liquid made of magnetic nanoparticles suspended within a solvent and having a particular surface tension, onto the substrate having one or more pads that are electrically coupled to a semiconductor layer;
place the chip with one or more solder balls that electrically coupled to logic elements of the chip, onto the deposited ferrofluid;
support the chip on the ferrofluid, in a substantially coplanar orientation to the substrate;
determine that the one or more solder balls of the chip are misaligned from a desired location on the one or more pads of the substrate; and
adjust, in response to the determination that the one or more solder balls of the chip are misaligned from the desired location on the one or more pads of the substrate, a position of the ferrofluid within a three-dimensional space with the magnetic unit until the one or more solder balls of the chip are aligned in the desired location on the one or more pads of the substrate.

2. The apparatus of claim 1, wherein the substrate is a wafer.

3. The apparatus of claim 1, wherein the one or more pads of the substrate further electrically couple to a second chip having one or more through silicon vias that electrically couple to the semiconductor layer.

4. The apparatus of claim 1, wherein the control unit is configured to place the chip for alignment on the substrate by:
   measuring a height of one or more solder balls;
   aligning the chip with one or more solder balls roughly above the desired location on the pads of the substrate before placement on the ferrofluid;
   monitoring a height of the ferrofluid; and
   adjusting the height of the ferrofluid in response to the height of the ferrofluid being less than the height of the solder balls.

5. The apparatus of claim 4, wherein the adjusting the height of the ferrofluid further comprises:
   adding a particular volume of the ferrofluid between the chip and the substrate.

6. The apparatus of claim 4, wherein the adjusting the height of the ferrofluid includes:
   adjusting, with the magnetic unit, a strength of a magnetic field.

7. The apparatus of claim 6, wherein an adjusting the strength of the magnetic field further comprises:
   altering a position of the magnetic unit in a three-dimensional space.

8. The apparatus of claim 1, wherein the control unit is further configured to:
   determine that the chip is aligned with the substrate; and
   bond the chip to the substrate in response to the determination that the one or more solder balls of the chip is aligned with the one or more pads of the substrate.

9. The apparatus of claim 8, wherein the control unit is configured to bond by:
   tacking the chip to the substrate.

10. The apparatus of claim 8, wherein the control unit is configured to bond by:
    coupling the chip to the substrate electrically.

* * * * *